(12) United States Patent
Hashemi et al.

(10) Patent No.: US 9,761,499 B2
(45) Date of Patent: Sep. 12, 2017

(54) SEMICONDUCTOR DEVICE STRUCTURE WITH 110-PFET AND 111-NFET CURRENT FLOW DIRECTION

(71) Applicant: International Business Machines Corporation, Armonk, NY (US)

(72) Inventors: Pouya Hashemi, White Plains, NY (US); Ali Khakifirooz, Los Altos, CA (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/246,963

(22) Filed: Aug. 25, 2016

(65) Prior Publication Data
US 2016/0379894 A1    Dec. 29, 2016

Related U.S. Application Data

(62) Division of application No. 14/748,558, filed on Jun. 24, 2015.

(51) Int. Cl.
*H01L 21/82*     (2006.01)
*H01L 21/84*     (2006.01)
(Continued)

(52) U.S. Cl.
CPC ........ *H01L 21/845* (2013.01); *H01L 21/0243* (2013.01); *H01L 21/0262* (2013.01); *H01L 21/02381* (2013.01); *H01L 21/02433* (2013.01); *H01L 21/02532* (2013.01); *H01L 21/02579* (2013.01); *H01L 21/30608* (2013.01); *H01L 21/76251* (2013.01); *H01L 21/823821* (2013.01); *H01L 27/0922* (2013.01); *H01L 27/0924* (2013.01); *H01L 27/1207* (2013.01); *H01L 27/1211* (2013.01);
(Continued)

(58) Field of Classification Search
CPC ..................... H01L 21/823431; H01L 29/785
See application file for complete search history.

(56) References Cited

U.S. PATENT DOCUMENTS 7,288,821 B2    10/2007  Kwon
7,704,852 B2     4/2010  Fogel et al.
(Continued)

FOREIGN PATENT DOCUMENTS

JP           59139622           8/1984

OTHER PUBLICATIONS

Majumdar, Amlan, et al., "Effects of Substrate Orientation and Channel Stress on Short-Channel Thin SOI MOSFETs", IEEE Transactions on Electron Devices, vol. 57, No. 9, Sep. 2010, pp. 2067-2072.

*Primary Examiner* — Mark Prenty
(74) *Attorney, Agent, or Firm* — Harrington & Smith; Louis J. Percello

(57) ABSTRACT

A FinFET comprises a hybrid substrate having a top wafer of (100) silicon, a handle wafer of (110) silicon, and a buried oxide layer between the top wafer and the handle wafer; a first set of fins disposed in the top wafer and oriented in a <110> direction of the (100) silicon; and a second set of fins disposed in the handle wafer and oriented in a <112> direction of the (110) silicon. The first set of fins and the second set of fins are aligned.

20 Claims, 14 Drawing Sheets

(51) Int. Cl.

| | |
|---|---|
| *H01L 29/04* | (2006.01) |
| *H01L 27/12* | (2006.01) |
| *H01L 21/762* | (2006.01) |
| *H01L 21/02* | (2006.01) |
| *H01L 21/306* | (2006.01) |
| *H01L 21/8238* | (2006.01) |
| *H01L 27/092* | (2006.01) |
| *H01L 29/161* | (2006.01) |
| *H01L 29/167* | (2006.01) |

(52) U.S. Cl.
CPC .......... *H01L 29/045* (2013.01); *H01L 29/161* (2013.01); *H01L 29/167* (2013.01)

(56) References Cited

U.S. PATENT DOCUMENTS

| | | |
|---|---|---|
| 7,785,939 B2 | 8/2010 | de Souza et al. |
| 8,193,567 B2 | 6/2012 | Kavalieros |
| 8,569,159 B2 | 10/2013 | Cheng |
| 8,765,534 B2 | 7/2014 | Owens |
| 2007/0224754 A1 | 9/2007 | Kwon |
| 2008/0050891 A1 | 2/2008 | Hsu et al. |
| 2016/0379894 A1* | 12/2016 | Hashemi ......... H01L 21/823821 438/427 |

* cited by examiner

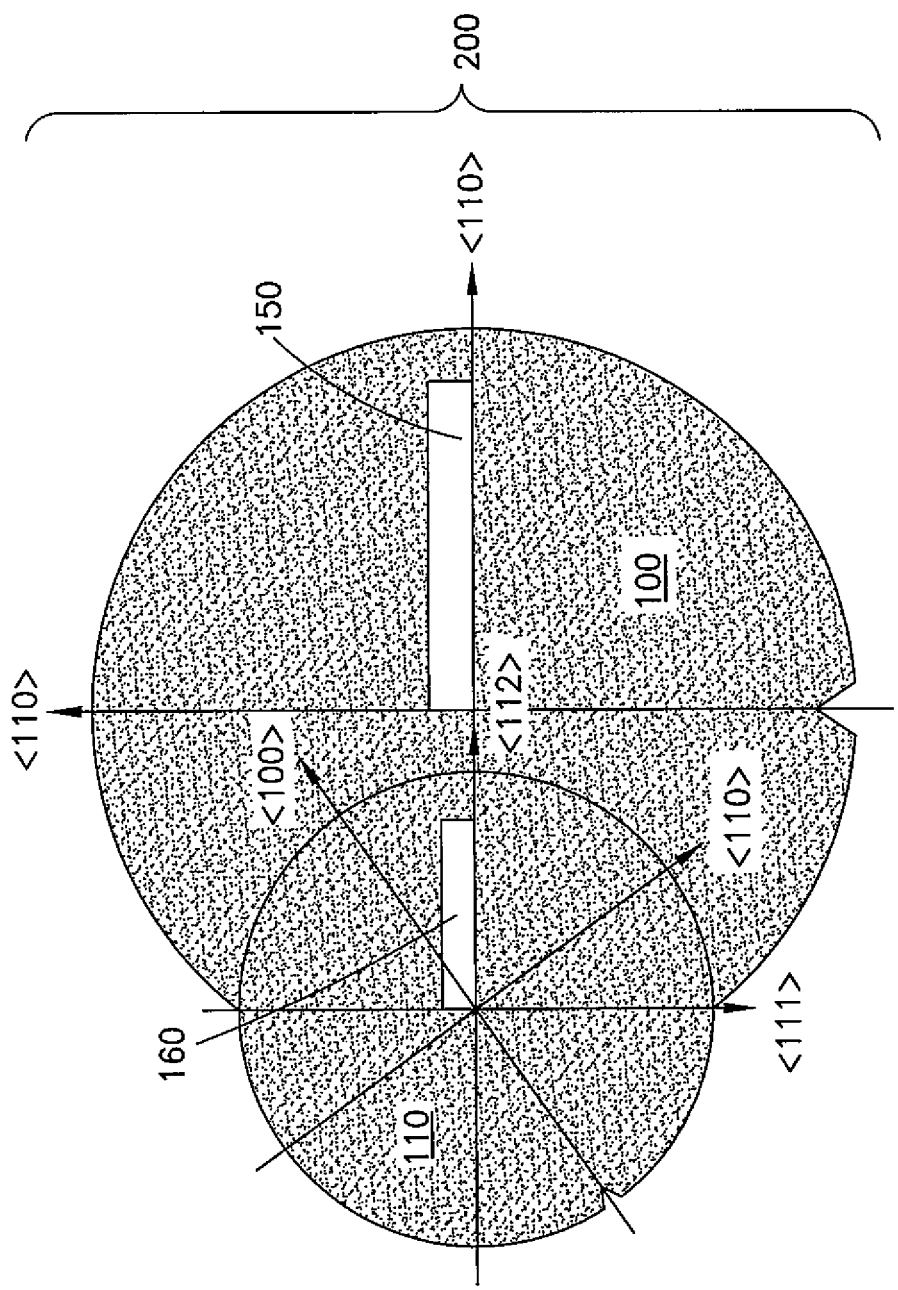

1200

Forming a hybrid substrate having a top wafer of (100) silicon, a handle wafer of (110) silicon, and a buried oxide layer between the top wafer and the handle wafer
1210

Applying a hardmask layer to a surface defined by the (100) silicon
1220

Forming trenches into the top wafer
1230

Forming trenches through the top wafer, through the buried oxide layer, and into the handle wafer
1240

Forming sidewall spacers on sidewalls of the trenches
1250

Epitaxially growing fins between the sidewall spacers in each trench
1260

SEMICONDUCTOR DEVICE STRUCTURE WITH 110-PFET AND 111-NFET CURRENT FLOW DIRECTION

CROSS REFERENCE TO RELATED APPLICATION

This patent application is a divisional application of copending U.S. patent application Ser. No. 14/748,558, filed on Jun. 24, 2015, the disclosure of which is incorporated by reference herein in its entirety.

BACKGROUND

The exemplary embodiments described herein relate generally to semiconductor devices and methods for the fabrication thereof and, more specifically, to semiconductor devices having PFET and NFET structures on the same substrate and methods for forming such structures.

A complementary metal oxide semiconductor device (CMOS) uses pairs of p-type and n-type metal oxide semiconductor field effect transistors (MOSFETs) arranged on silicon or silicon-on-insulator (SOI) substrates. A MOSFET, which is used for amplifying or switching electronic signals for logic functions, has source and drain regions connected by a channel. The source region is a terminal through which current in the form of majority charge carriers enters the channel, and the drain region is a terminal through which current in the form of majority charge carriers leaves the channel. In a p-type MOSFET (hereinafter "PFET"), the majority charge carriers are holes that flow through the channel, and in an n-type MOSFET (hereinafter "NFET"), the majority charge carriers are electrons that flow through the channel. A gate overlies the channel and controls the flow of current between the source and drain regions. The channel may be defined by a thin "fin" through which the gate controls the flow of current, thereby making the PFETs and NFETs "FinFET" devices.

The material of the channel or fin generally includes silicon (Si). Particularly with regard to some semiconductor devices in which high performance targets are desired, the channel or fin may be a high percentage (HP) SiGe material or pure germanium (Ge). However, due to high amounts of lattice mismatch, HP SiGe or Ge grown directly on silicon may be defective. When employing HP SiGe or Ge as PFETs, desirable high performance results are generally observed for {110} crystallographic planes, and when employing HP SiGe or Ge as NFETs, desirable high performance results are generally observed for {111} crystallographic planes. The use of both {110} and {111} crystallographic planes on a single FinFET or fin-type structure using HP SiGe or Ge has heretofore been problematic.

BRIEF SUMMARY

In one exemplary aspect, a structure comprises a first substrate comprising (100) silicon and having at least one fin comprising at least one group IV element; an oxide layer on the first substrate; and a second substrate comprising (110) silicon on the oxide layer and having at least one fin comprising at least one group IV element, the at least one fin on the second substrate being aligned with the at least one fin on the first substrate.

In another exemplary aspect, a FinFET comprises a hybrid substrate having a top wafer of (100) silicon, a handle wafer of (110) silicon, and a buried oxide layer between the top wafer and the handle wafer; a first set of fins disposed in the top wafer and oriented in a <110> direction of the (100) silicon; and a second set of fins disposed in the handle wafer and oriented in a <112> direction of the (110) silicon. The first set of fins and the second set of fins are aligned.

In another exemplary aspect, a method comprises forming a substrate comprising a top wafer of (100) silicon, a handle wafer of (110) silicon, and a buried oxide layer between the top wafer and the handle wafer, wherein the top wafer and the handle wafer are arranged such that a <110> direction of the (100) silicon of the top wafer aligns with a <112> direction of the (110) silicon of the handle wafer; forming trenches in the top wafer; forming trenches through the top wafer and into the handle wafer; and disposing fins in the trenches.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIG. 4 is a schematic representation of a bottom view of a hybrid substrate formed by the substrates of FIGS. 1A and 1B;

FIG. 12 is a logic flow diagram that illustrates the operation of an exemplary method, and a result of execution of computer program instructions embodied on a computer readable memory, in accordance with an exemplary embodiment of the methods for forming the FinFET structures described herein;

DETAILED DESCRIPTION

Exemplary embodiments of fin-type structures defined by both {110} and {111} crystallographic planes and methods for forming such structures are disclosed herein. The fin-type structures are generally FinFETs that use HP SiGe (or Ge or other high-mobility Group IV semiconductor materials) on a single hybrid substrate to increase CMOS performance (in both the PFET and the NFET aspects). One HP SiGe is 60% boron-doped SiGe alloy. Crystal orientations and the benefits thereof during semiconductor device manufacturing are known to a person of skill in the art and, therefore, are not described further in detail herein. It should be understood that the disclosed embodiments are merely illustrative of the claimed structures and methods and that such structures and methods may be embodied in various forms. These various forms should not be construed as being limited to the exemplary embodiments set forth herein.

Figure 1A:
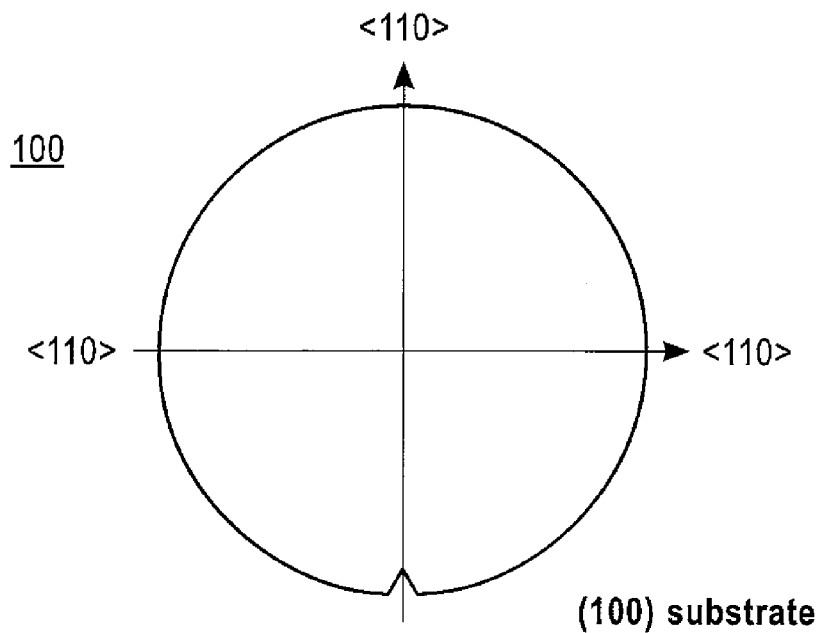
FIGS. 1A and 1B are schematic representations of (100) and (110) substrates having crystallographic planes of {110} and {111}, respectively.
Figure 1B:
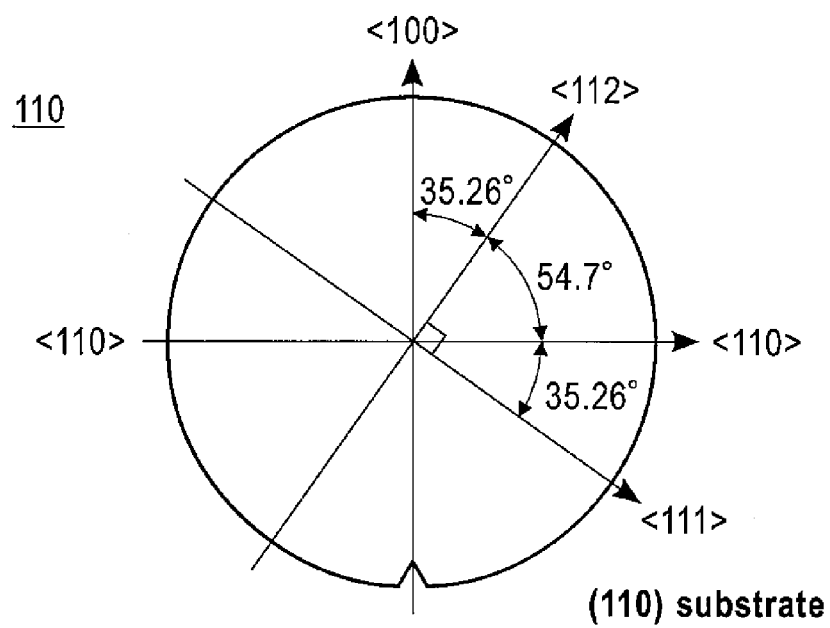

Referring to FIGS. 1A and 1B, exemplary embodiments of a (100) silicon substrate (hereinafter "substrate 100") and a (110) silicon substrate (hereinafter "substrate 110") are shown, respectively. Because of the (100) configuration of the silicon in substrate 100, a fin extending in the <110> direction on the substrate 100 of FIG. 1A would have sidewalls having crystal orientations of {110}. Because of the (110) configuration of the silicon in substrate 110, a fin extending in the <112> direction on the substrate 110 of FIG. 1B would have sidewalls having crystal orientations of {111}. In substrate 110, the <112> direction forms an angle of about 35.3 degrees from a <100> direction and an angle of about 54.7 degrees from the <110> direction.

Figure 2A:
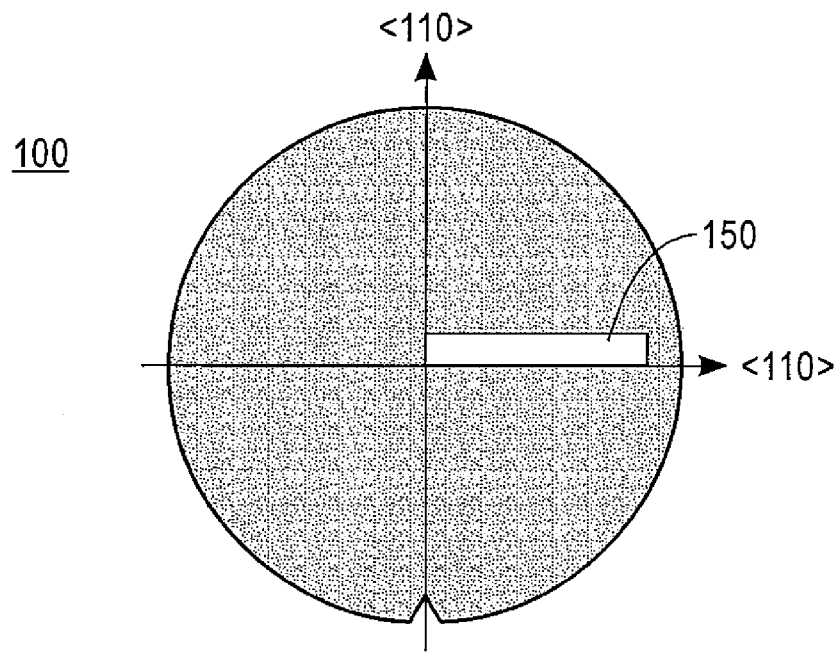
FIGS. 2A and 2B are schematic representations of the substrates of FIGS. 1A and 1B showing fin directions <110> and <112>, respectively.

As shown in FIG. 2A, the substrate 100 is configured to receive a fin 150 oriented in the <110> direction (which corresponds to standard POR wafers). The fin 150 is shown to illustrate the orientation of one or more prospective fins 150 on the substrate 100 when methods of forming FinFETs or other fin-type structures of HP SiGe (or Ge) are to be carried out. When formed, the one or more fins 150 may include sidewalls extending in the <110> direction with {110} crystal orientations and be substantially longer in one dimension than in the other two dimensions.

Figure 2B:
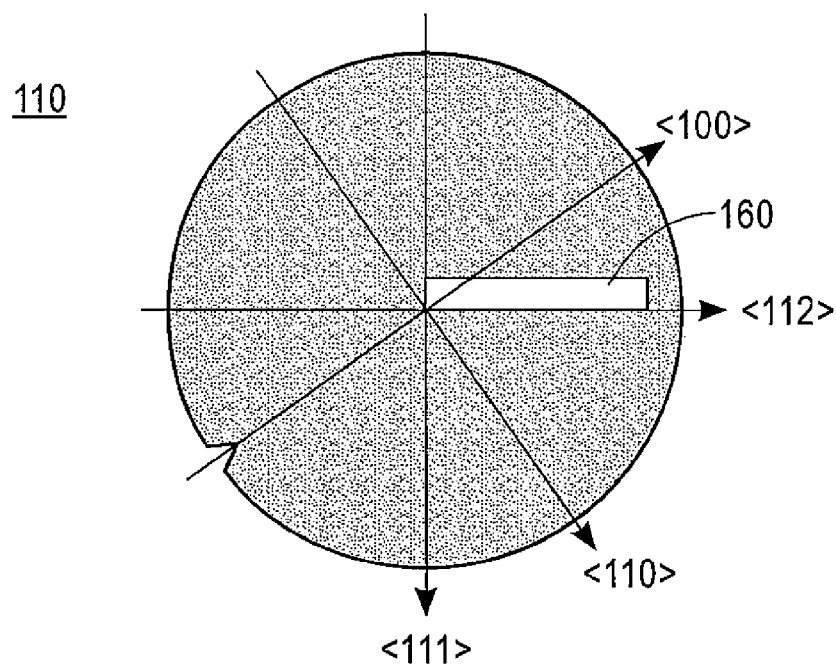

As shown in FIG. 2B, the substrate 110 is configured to receive a fin 160 oriented in the <112> direction. The fin 160 is shown to illustrate the orientation of one or more fins 160 on the substrate 110 when methods of forming FinFETs or other fin-type structures of HP SiGe (or Ge) are to be carried out. When formed, the one or more fins 160 may include sidewalls extending in the <112> direction with {111} crystal orientations and be angled about 35.3 degrees from the <100> direction and about 54.7 degrees from the <110> direction. As with fin 150, when formed, the one or more fins 160 may be substantially longer in one dimension than in the other two dimensions.

Figure 3A:
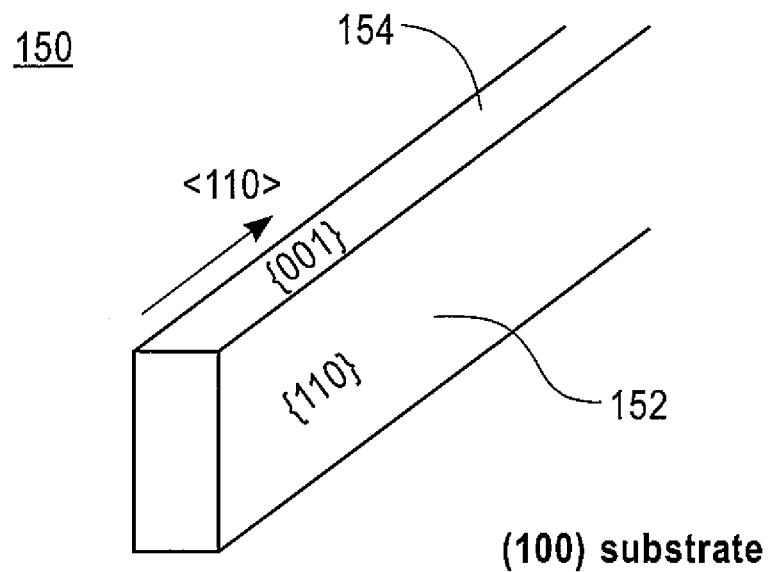
FIGS. 3A and 3B are schematic representations of portions of fins grown on the substrates of FIGS. 1A and 1B, respectively.

As shown in FIG. 3A, one exemplary fin 150 (when formed on the Substrate 100) extends in the <110> direction with a sidewall 152 of the fin 150 having a crystal orientation of {110}. A top wall 154 of the fin 150 has a crystal orientation of {001}.

Figure 3B:
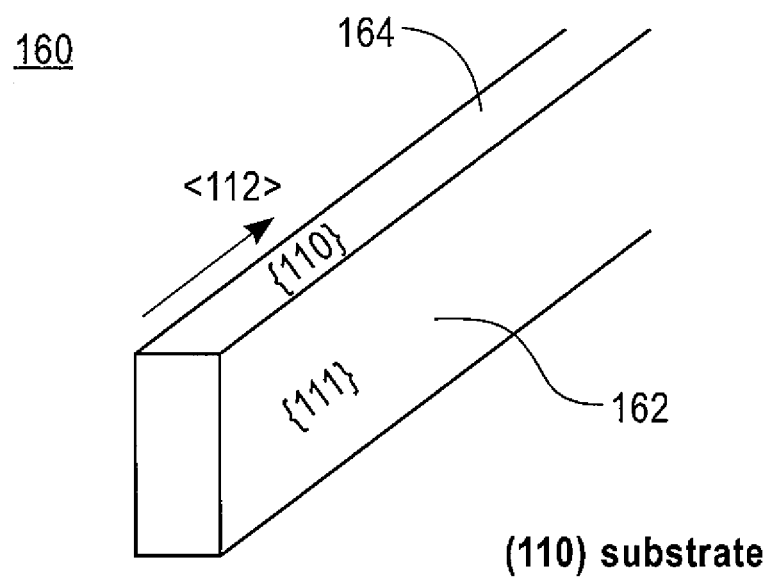

As shown in FIG. 3B, one exemplary fin 160 (when formed on the substrate 110) extends in the <112> direction with a sidewall 162 of the fin 160 having a crystal orientation of {111}. A top wall 164 of the fin 160 has a crystal orientation of {110}.

Figure 5:
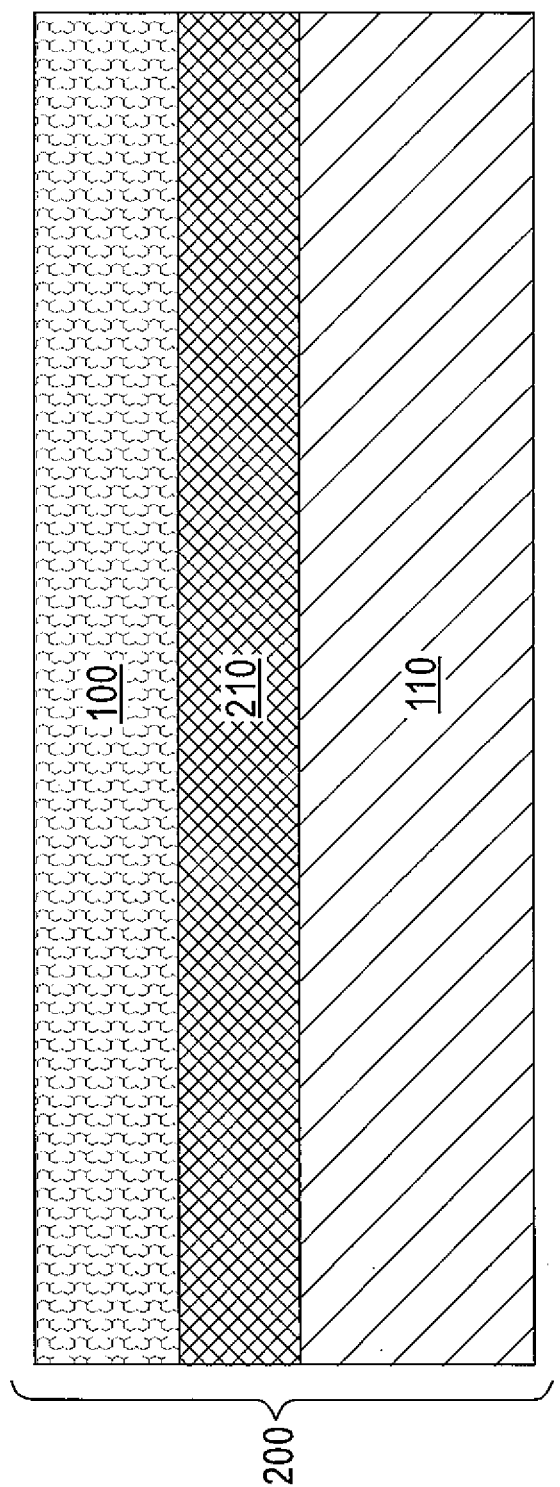
FIG. 5 is a schematic representation of a side view of the substrate of FIG. 4.

As shown in FIGS. 4 and 5, a hybrid configuration of the substrate 100 and the substrate 110 is shown generally at 200 and is hereinafter referred to as "hybrid substrate 200." In the hybrid substrate 200, the substrate 110 is configured as a handle wafer, and the substrate 100 is configured as a top wafer over the handle wafer, with the substrate 110 being rotated about 54.7 degrees relative to the substrate 100 to align the <112> direction of the substrate 110 with the <110> direction of substrate 100. A buried oxide layer (shown at 210 in FIG. 5 and hereinafter referred to as "BOX 210") is disposed between the substrate 100 and the substrate 110.

In one exemplary hybrid substrate 200, the BOX 210 is formed by depositing an oxide layer (e.g., $SiO_2$) on a surface (e.g., an upper surface) of the substrate 110 (the handle wafer). A surface (e.g., a lower surface) of the substrate 100 (the top wafer) is attached to the oxide layer, thereby forming the BOX 210. The substrate 100 is generally attached to the BOX 210 using a layer transfer technique employing a thermal activation process. In such a process, a donor substrate wafer (in this case the substrate 100) is sliced horizontally, and a thin layer from the donor substrate wafer is placed onto and bonded to a new substrate (in this case the BOX 210). One exemplary layer transfer technique that may be used is SMART CUT, which is available from S.O.I.TEC, S.A., of Grenoble, France. The exemplary embodiments as described herein are not limited to the attachment of the substrate 100 (the top wafer) to the BOX 210, as the BOX 210 may be deposited on the lower surface of the substrate 100 (the top wafer) and the upper surface of the substrate 110 (the handle wafer) may be attached to the BOX 210. However, as the SMART CUT layer transfer technique may be easier to employ on a substrate having a crystal orientation of {100}, this layer transfer technique is generally carried out on the substrate 100. Furthermore, the assembly of the hybrid substrate 200 is not limited to SMART CUT or any other layer transfer technique, as other methods of attaching the top wafer to the BOX (or the BOX to the handle wafer) may be used.

Referring now to FIGS. 5 through 10, one exemplary method of forming a FinFET or other fin-type structure on a single hybrid substrate to produce a CMOS having both PFET and NFET aspects is described.

Figure 6:
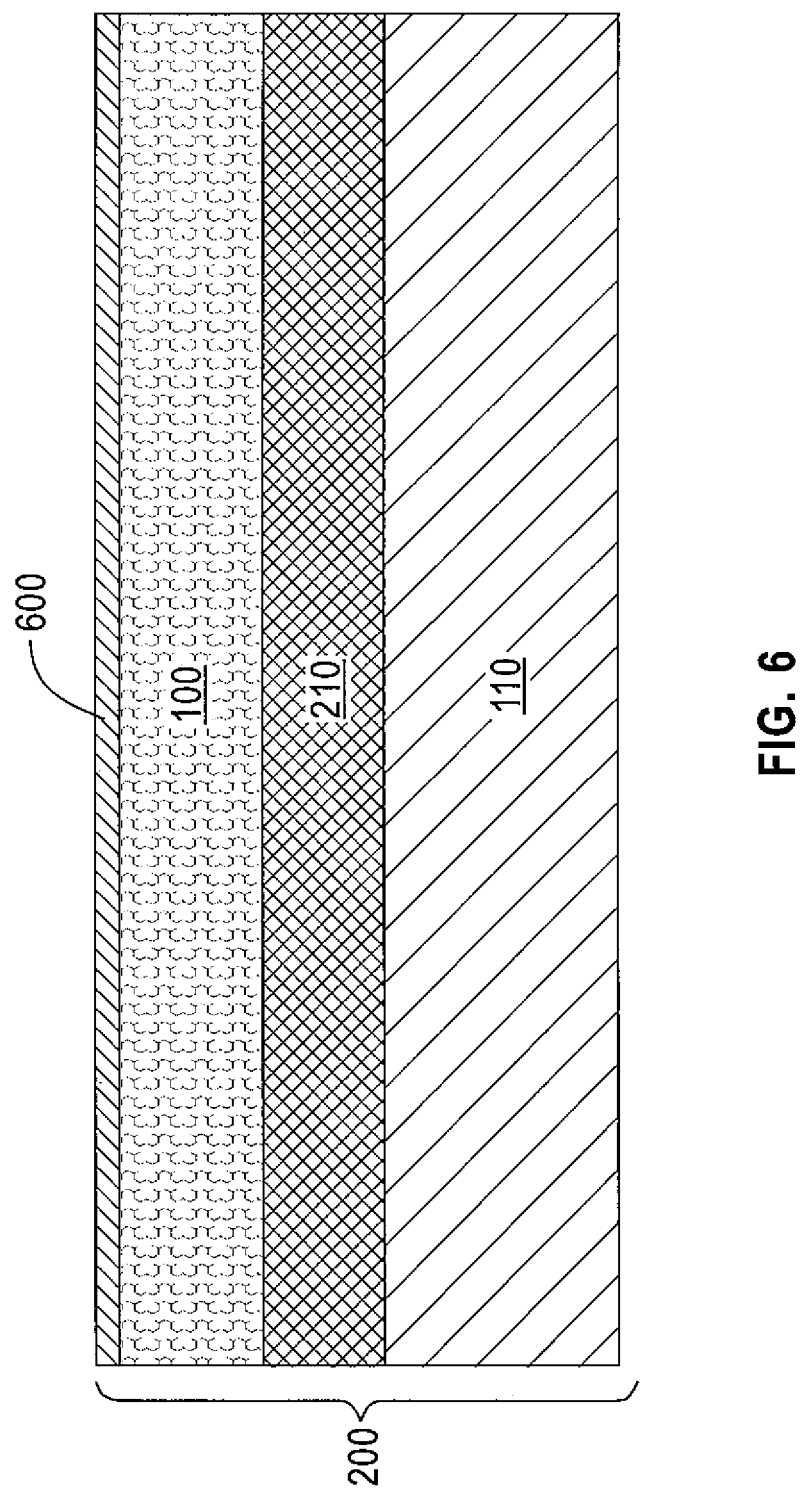
FIG. 6 is a schematic representation of the side view of the substrate of FIG. 5 on which a hardmask layer is disposed.

As shown in FIG. 6, a hardmask layer 600 is formed on the hybrid substrate 200, as shown in FIG. 5, and patterned. The hardmask layer 600 may comprise $SiO_2$, a silicon nitride, or the like and may be deposited using chemical vapor deposition (CVD), physical vapor deposition (PVD), or a similar technique on an upper surface of the substrate 100.

Figure 7:
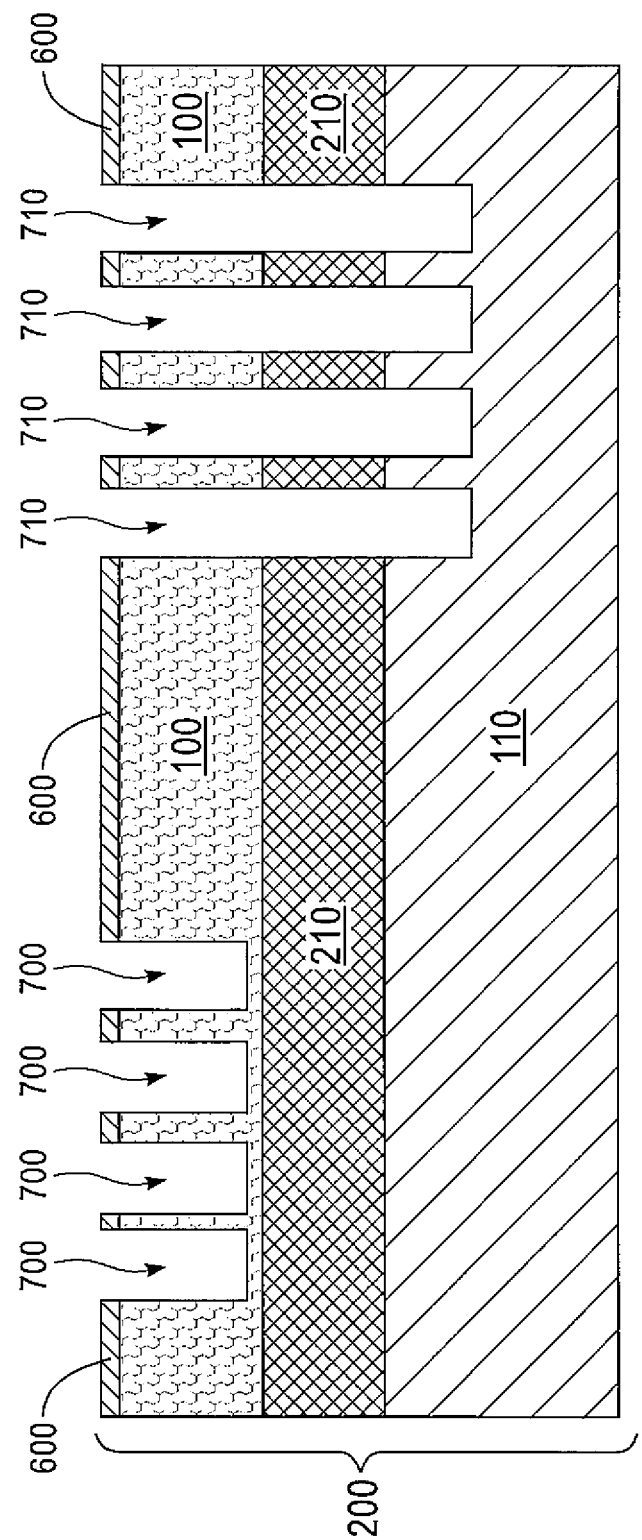
FIG. 7 is a schematic representation of the side view of the substrate of FIG. 6 having trenches formed therein.

As shown in FIG. 7, trenches 700 are formed through the hardmask layer 600 into the substrate 100. Because the trenches 700 terminate in the substrate 100 and extend in the <110> direction of substrate 100, the trenches 700 will form the fins 150 of the PFET aspect of the FinFET. Trenches 710 are also formed through the hardmask layer 600 and through the substrate 100 and the BOX 210 and into the substrate 110. Because the trenches 710 terminate in the substrate 110 and extend in the <112> direction of substrate 110, the trenches 710 will form the fins 160 of the NFET aspect of the FinFET. The trenches 700, as well as the trenches 710, are formed by an etch process. Exemplary etch processes include, but are not limited to, wet etch techniques (e.g., etching using polyphosphoric acids, hydrofluoric acid (HF), potassium hydroxide, or the like) or plasma or gas etch techniques.

Figure 8:
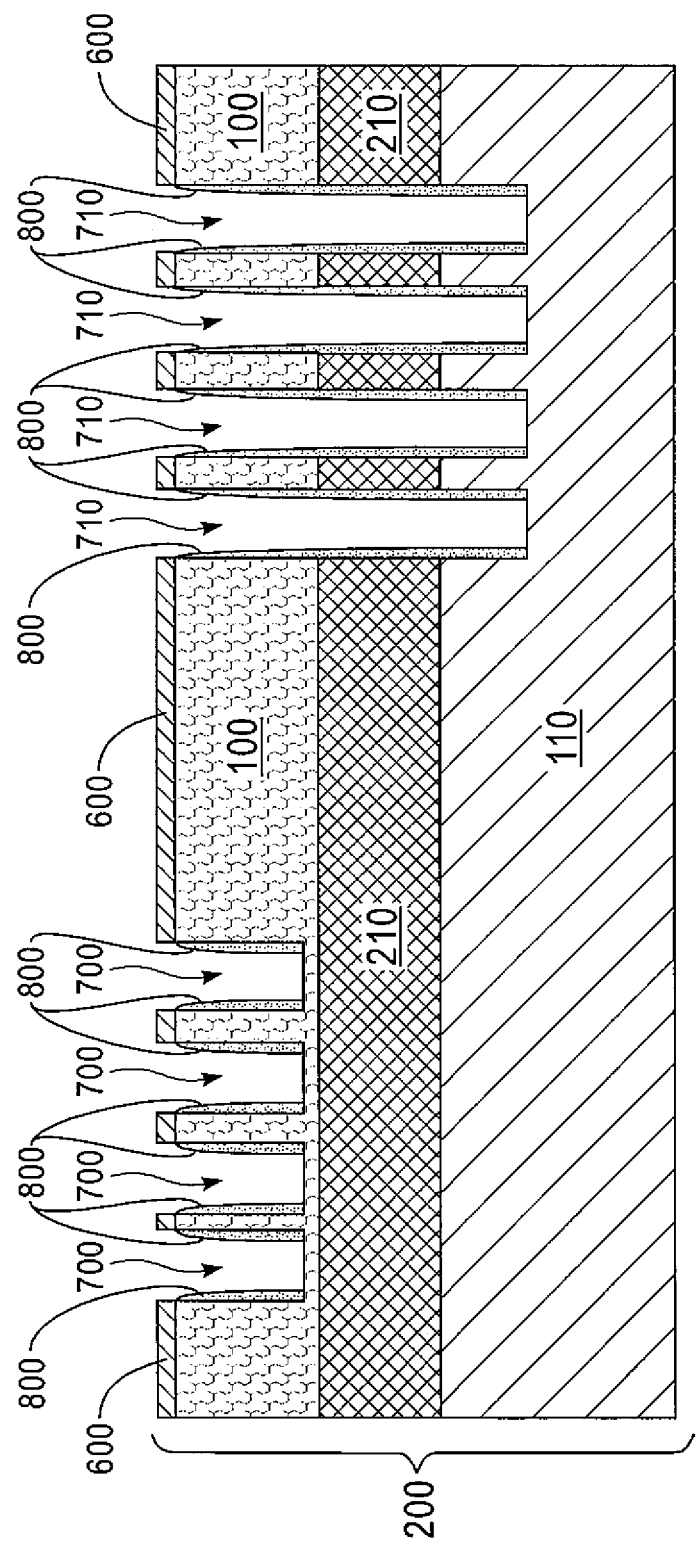
FIG. 8 is a schematic representation of the side view of the substrate of FIG. 7 having sidewalls formed in the trenches.

As shown in FIG. 8, sidewall spacers 800 are formed in each of the trenches 700 and the trenches 710 and extend to the bottom surfaces of each trench. The sidewall spacers 800 are formed by the deposition of dielectric material, such as $SiO_2$, silicon nitride, low-permittivity (low-K) dielectrics such as $SiO_xN_y$, or boron nitride, in the trenches 700, 710 via CVD or low pressure CVD (LPCVD).

Figure 9:
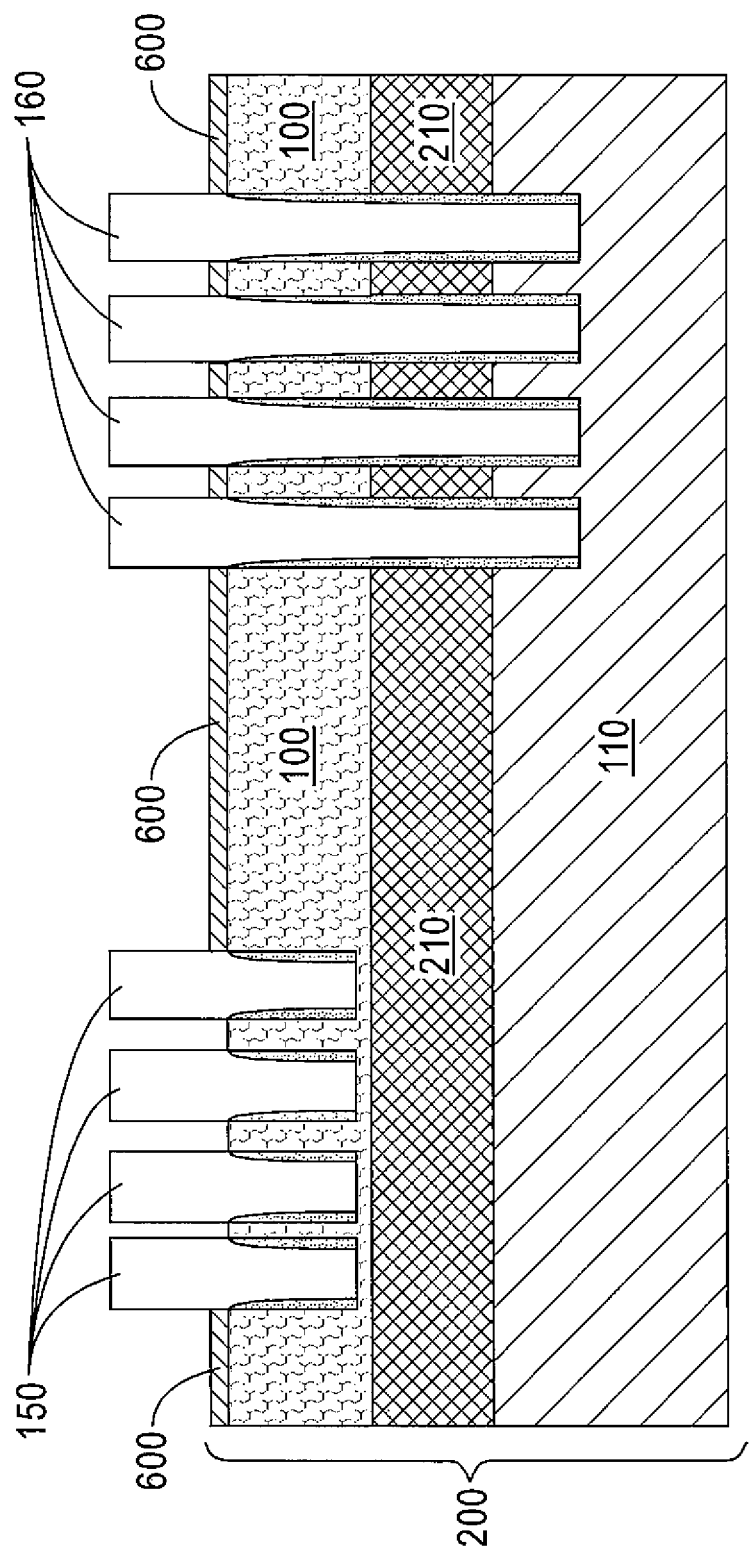
FIG. 9 is a schematic representation of the side view of the substrate of FIG. 8 having fins disposed between the sidewalls.

As shown in FIG. 9, the trenches 700, 710 are filled between the sidewall spacers 800 with either the HP SiGe or the pure Ge. In one exemplary embodiment, Ge is grown in the trenches 700, 710 using an aspect ratio trapping (ART)

technique. The ART technique involves epitaxially growing the Ge (or the HP SiGe) using metal-organic CVD. Such epitaxial growth forms Ge fins 150 in the substrate 100 with sidewalls extending in the <110> direction of substrate 100 and Ge fins 160 extending through the substrate 100 and the BOX 210 and into the substrate 110 with sidewalls extending in the <112> direction of substrate 110.

Figure 10:
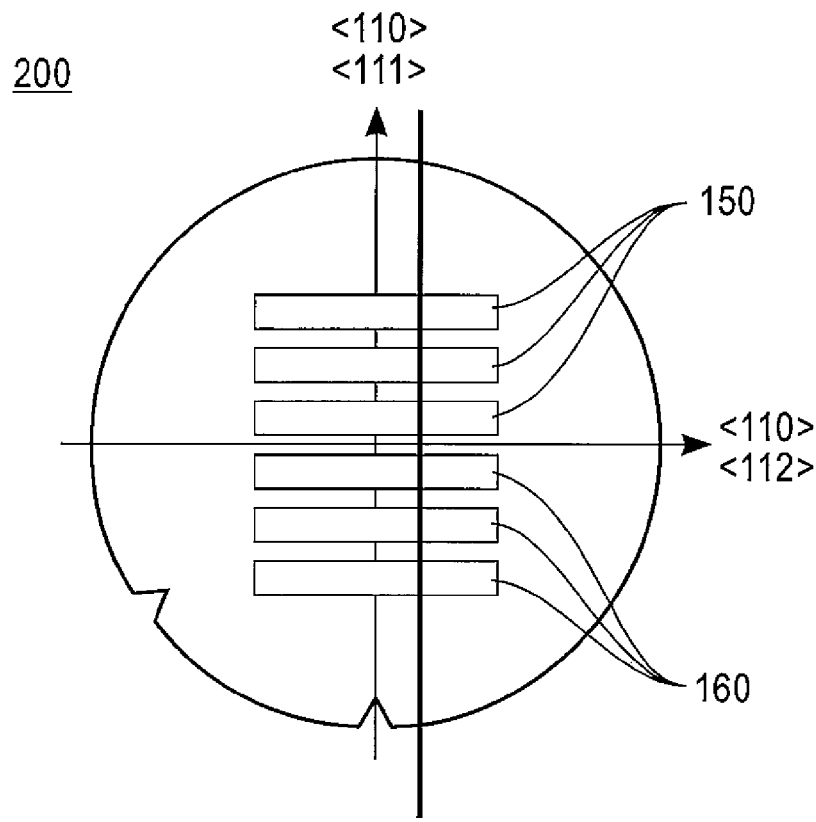
FIG. 10 is a schematic representation of a top view of the substrate of FIG. 9.

As shown in FIG. 10, the hybrid substrate 200 includes a plurality of fins 150 arranged with fins 160. In some exemplary embodiments, fins 150, 160 that are about 6 to 10 nm in width may be epitaxially grown as indicated above. In other exemplary embodiments, the fins 150, 160 may be printed on the wafers using a technique in which larger features of the fins are epitaxially grown and cut out using sidewall image transfer (SIT). The fins 150 define the PFET having current flows on the {110} surfaces, and the fins 160 define the NFET having current flows on the {111} surfaces. Because the substrate 110 is rotated about 54.7 degrees relative to the substrate 100 such that the direction of crystal orientation of {111} coincides with the direction of crystal orientation {110}, the fins 150 and the fins 160 are aligned. Although the exemplary embodiments depicted herein illustrate the fins 150 protruding from the surface of the substrate 100 and the fins 160 extending from the substrate 110, through the BOX 210, and through the substrate 100 to protrude from a top surface of the hybrid substrate 200, the FinFETs described herein are not so limited, as the fins 160 may be located on the substrate 110 so as to protrude from the hybrid substrate 200 opposite the fins 150.

Figure 11:
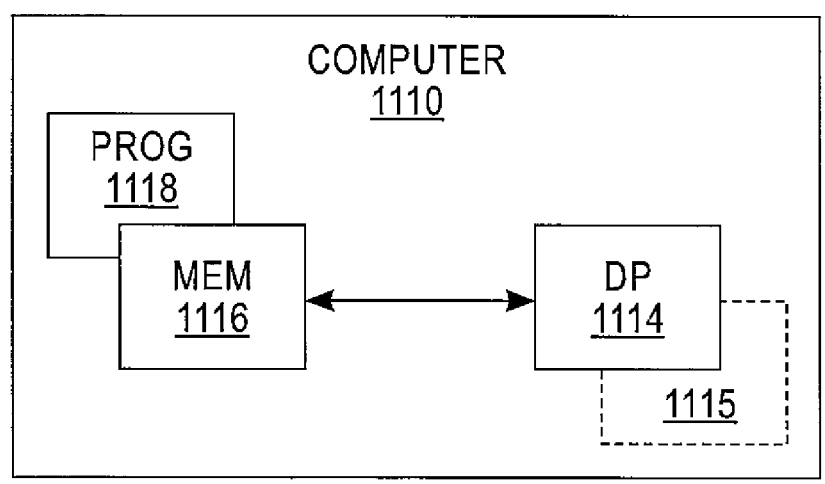
FIG. 11 is a block diagram of various electronic devices and apparatuses that may be suitable for use in forming the FinFET structures described herein.

As shown in FIG. 11, a simplified block diagram of various electronic devices and apparatuses that are suitable for use in practicing the exemplary embodiments described herein is shown. For example, a computer 1110 may be used to control one or more of the fabrication processes (e.g., deposition of hardmask layers 600, formation of trenches 700, 710, deposition of sidewall spacers 800, epitaxial growth of fins 150, 160, and the like) as described above. The computer 1110 includes a controller, such as a computer or a data processor (DP) 1114 and a computer-readable memory medium embodied as a memory (MEM) 1116 that stores a program of computer instructions (PROG) 1118.

The PROG 1118 includes program instructions that, when executed by the associated DP 1114, enable the various electronic devices and apparatus to operate in accordance with exemplary embodiments. That is, various exemplary embodiments may be implemented at least in part by computer software executable by the DP 1114 of the computer 1110, or by hardware, or by a combination of software and hardware (and firmware).

The computer 1110 may also include dedicated processors, for example processor 1115 used for carrying out methods for fabricating the fins 150, 160.

The computer readable MEM 1116 may be of any type suitable to the local technical environment and may be implemented using any suitable data storage technology, such as semiconductor based memory devices, flash memory, magnetic memory devices and systems, optical memory devices and systems, fixed memory, and removable memory. The DP 1114 may be of any type suitable to the local technical environment, and may include one or more of general purpose computers, special purpose computers, microprocessors, digital signal processors (DSPs), and processors based on a multicore processor architecture, as non-limiting examples.

The exemplary embodiments, as discussed herein and as particularly described with respect to exemplary methods, may be implemented in conjunction with a program storage device (e.g., at least one memory) readable by a machine, tangibly embodying a program of instructions (e.g., a program or computer program) executable by the machine for performing operations. The operations comprise utilizing the exemplary embodiments of the method.

FIG. 12 is a logic flow diagram that illustrates the operation of a method 1200 (and a result of an execution of computer program instructions (such as PROG 1118)), in accordance with the exemplary embodiments. In accordance with these exemplary embodiments, a hybrid substrate is formed at block 1210. The hybrid substrate may be the hybrid substrate 200 as described herein, e.g., having a top wafer comprising a (100) silicon substrate, a handle wafer comprising a (110) silicon substrate, and a BOX located between the top wafer and the handle wafer, with the <112> direction of the (110) substrate aligned to the <110> direction of the (100) substrate. As indicated at block 1220, a hardmask layer is applied to a surface defined by the (100) silicon substrate (the top wafer). However, the application of the hardmask layer is not so limited, as the hardmask layer may be applied to a surface of the handle wafer. As indicated at block 1230, a first set of one or more trenches is formed in the top wafer so as to terminate in top wafer before reaching the BOX. As indicated at block 1240, a second set of one or more trenches is formed in the top wafer, through the BOX, and into the handle wafer so as to terminate in the handle wafer. As indicated at block 1250, sidewall spacers are formed in the trenches. As indicated at block 1260, fins comprising HP SiGe or Ge are epitaxially grown between the sidewall spacers in each trench.

The various blocks of method 1200 shown in FIG. 12 may be viewed as method steps, and/or as operations that result from operation of computer program code, and/or as a plurality of coupled logic circuit elements constructed to carry out the associated function(s).

Example 1—Field Mobility in Scaled Devices

Figure 13A:
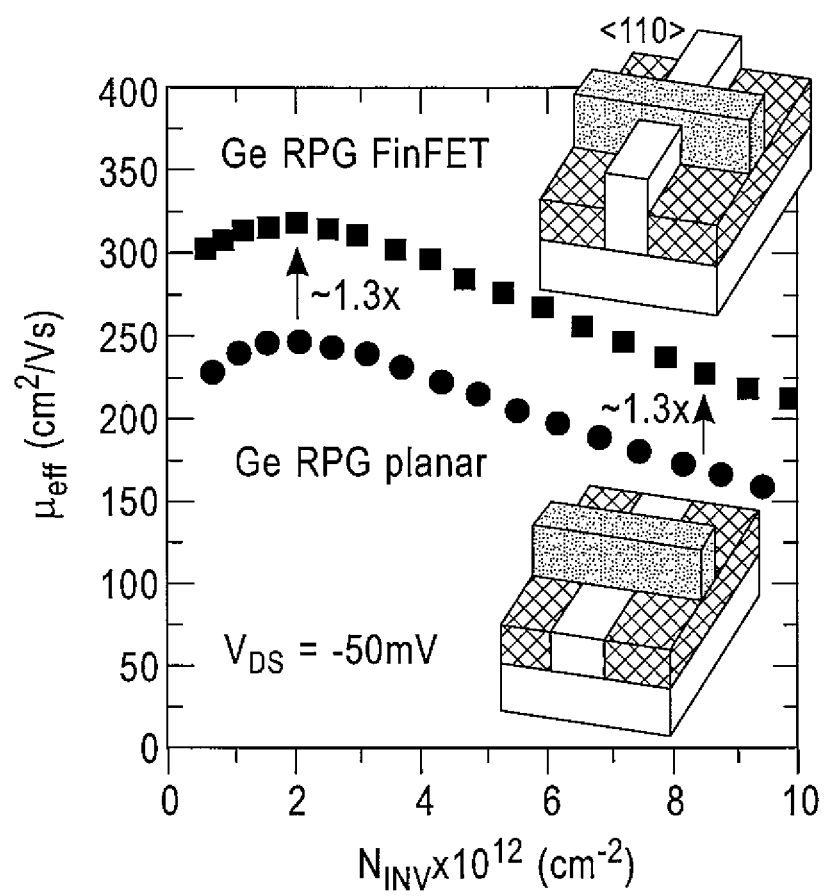
FIGS. 13A and 13B are graphical representations of effective hole mobility of Ge FinFETs.
Figure 13B:
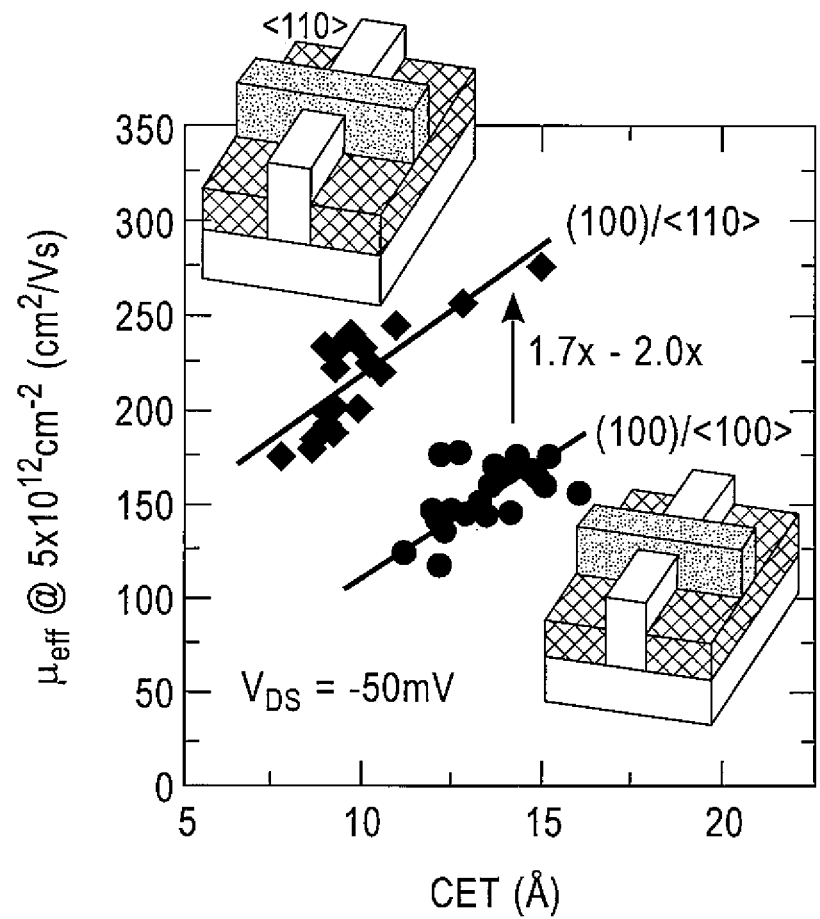

As shown in FIGS. 13A and 13B, PFET hole mobility is illustrated for a device having 8 nanometer (nm) fins of Ge. As shown in FIG. 13A, effective hole mobility was extracted by split C-V (capacitance-voltage) method at $V_{ds}=-50$ mV for $L_g=1$ micrometer (um) Ge RPG planar (CET=15.6 angstroms) and Ge RPG FinFET (CET=15 angstroms). The observed 30% mobility increase was attributed to a higher hole mobility of the sidewalls. FIG. 13B illustrates effective hole mobility at $5\times10^{12}$ cm$^{-2}$ sheet hole density between Ge RPG FinFETs with <110> and <100> current direction while keeping (100) top surface orientation. Up to 100% mobility increase was observed for a CET range between 15 angstroms and 8 angstroms. Based on FIGS. 13A and 13B, a clear orientation difference between <110> and <100> current directions in 8 nm Ge FinFETs was observed.

Example 2—Short Channel Characteristics for Ge Nanowire

Figure 14:
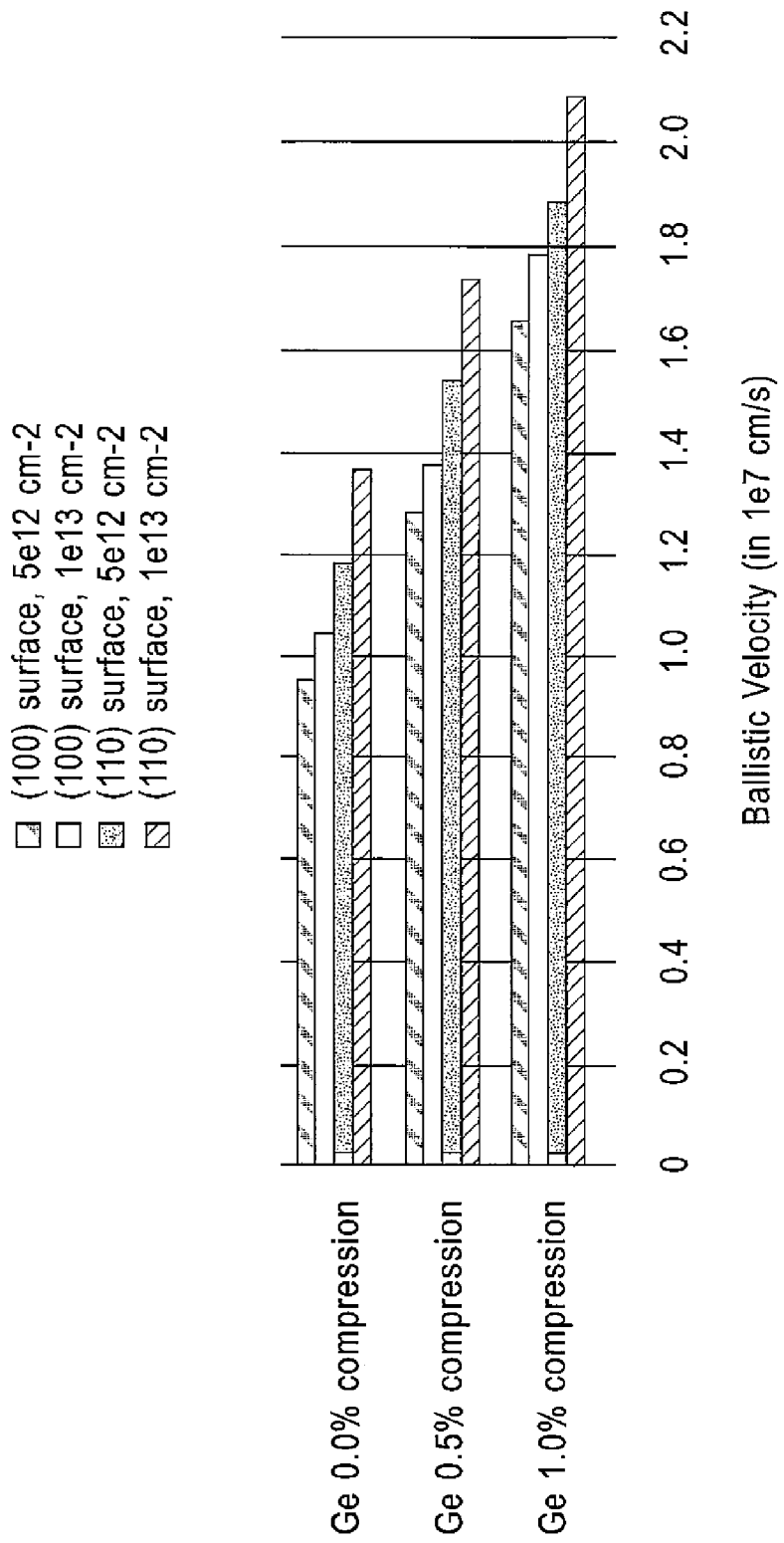
FIG. 14 is a graphical representation of short channel characteristics for Ge nanowire.

As shown in FIG. 14, for Ge nanowire, an extreme ballistic velocity simulation showed that orientation had an effect on the compression of the Ge since the effective mass was indicated as changing. Compression data for Ge was determined at strain levels of 0, 0.5%, and 1%.

Referring now to all the Figures and the Examples described above, in one exemplary embodiment, a structure comprises a first substrate comprising (100) silicon and having at least one fin comprising at least one group IV element; an oxide layer on the first substrate; and a second substrate comprising (110) silicon on the oxide layer and having at least one fin comprising at least one group IV element, the at least one fin on the second substrate being aligned with the at least one fin on the first substrate.

In the structure, the at least one group IV element may comprise germanium. The germanium may be 60% boron-doped SiGe alloy. The at least one fin of the first substrate may be oriented in a <110> direction of the (100) silicon, and the at least one fin of the second substrate may be oriented in a <112> direction of the (110) silicon. Sidewalls of the at least one fin oriented in a <110> direction of the (100) silicon may have a {110} crystallographic plane, and sidewalls of the at least one fin oriented in a <112> direction of the (110) silicon may have a {111} crystallographic plane. The oxide layer may be SiO$_2$. The at least one fin of the first substrate may extend from a surface of the first substrate, and the at least one fin of the second substrate may extend from the second substrate, through the oxide layer, and through the first substrate.

In another exemplary embodiment, a FinFET comprises a hybrid substrate having a top wafer of (100) silicon, a handle wafer of (110) silicon, and a buried oxide layer between the top wafer and the handle wafer; a first set of fins disposed in the top wafer and oriented in a <110> direction of the (100) silicon; and a second set of fins disposed in the handle wafer and oriented in a <112> direction of the (110) silicon. The first set of fins and the second set of fins are aligned.

In the FinFET, the first set of fins and the second set of fins may comprise germanium. The germanium may be 60% boron-doped SiGe. Sidewalls of the fins oriented in a <110> direction of the (100) silicon may have a {110} crystallographic plane, and sidewalls of the fins oriented in a <112> direction of the (110) silicon may have a {111} crystallographic plane. The fins oriented in a <110> direction of the (100) silicon may define a PFET, and the fins oriented in a <112> direction of the (110) silicon may define an NFET.

In another exemplary embodiment, a method comprises forming a substrate comprising a top wafer of (100) silicon, a handle wafer of (110) silicon, and a buried oxide layer between the top wafer and the handle wafer, wherein the top wafer and the handle wafer are arranged such that a <110> direction of the (100) silicon of the top wafer aligns with a <112> direction of the (110) silicon of the handle wafer; forming trenches in the top wafer; forming trenches through the top wafer and into the handle wafer; and disposing fins in the trenches.

In the method, forming a substrate may comprise slicing a wafer of (100) silicon horizontally and bonding the sliced wafer onto the buried oxide layer opposite the handle wafer to form the top wafer. Forming a substrate may comprise slicing a wafer of (110) silicon horizontally and bonding the sliced wafer onto the buried oxide layer opposite the top wafer to form the handle wafer. The method may further comprise applying a hardmask layer on the top wafer before forming trenches in the top wafer and before forming trenches through the top wafer and into the handle wafer. The method may further comprise forming sidewall spacers on sidewalls of the trenches before disposing fins in the trenches. Disposing fins in the trenches may comprise epitaxially growing fins in the trenches. Epitaxially growing fins in the trenches may comprise using metal-organic chemical vapor deposition to grow a group IV element in the trenches. The group IV element may comprise 60% boron-doped SiGe or pure Ge.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

The invention claimed is:

1. A method, comprising:
   forming a substrate comprising a top wafer of (100) silicon, a handle wafer of (110) silicon, and a buried oxide layer between the top wafer and the handle wafer, wherein the top wafer and the handle wafer are arranged such that a <110> direction of the (100) silicon of the top wafer aligns with a <112> direction of the (110) silicon of the handle wafer;
   forming first trenches in the top wafer;
   forming second trenches through the top wafer and into the handle wafer; and
   disposing fins in the first and second trenches.

2. The method of claim 1, wherein forming a substrate comprises slicing a wafer of (100) silicon horizontally and bonding the sliced wafer onto the buried oxide layer opposite the handle wafer to form the top wafer.

3. The method of claim 1, wherein forming a substrate comprises slicing a wafer of (110) silicon horizontally and bonding the sliced wafer onto the buried oxide layer opposite the top wafer to form the handle wafer.

4. The method of claim 1, further comprising applying a hardmask layer on the top wafer before forming the first trenches in the top wafer and before forming the second trenches through the top wafer and into the handle wafer.

5. The method of claim 1, further comprising forming sidewall spacers on sidewalls of the first and second trenches before disposing fins in the first and second trenches.

6. The method of claim 1, wherein disposing fins in the first and second trenches comprises epitaxially growing fins in the first and second trenches.

7. The method of claim 6, wherein epitaxially growing fins in the first and second trenches comprises using metal-organic chemical vapor deposition to grow a group IV element in the first and second trenches.

8. The method of claim 7, wherein the group IV element comprises 60% boron-doped SiGe or pure Ge.

9. A method of forming a hybrid substrate, the method comprising:
forming an oxide layer on an upper surface of a first substrate comprising (110) silicon;
coupling a lower surface of a second substrate comprising (100) silicon to the oxide layer;
forming a first set of trenches in the second substrate;
forming a second set of trenches through the second substrate and into the first substrate;
forming a first set of fins in the first set of trenches; and
forming a second set of fins in the second set of trenches;
wherein the second substrate and the first substrate are arranged such that a <110> direction of the (100) silicon of the second substrate aligns with a <112> direction of the (110) silicon of the first substrate.

10. The method of claim 9, wherein the lower surface of the second substrate is coupled to the oxide layer using a layer transfer technique employing a thermal activation process.

11. The method of claim 10, wherein the layer transfer technique comprises slicing the second substrate horizontally and bonding a thin layer of the sliced second substrate onto the oxide layer.

12. The method of claim 9, wherein forming a first set of trenches in the second substrate comprises forming a hardmask layer on an upper surface of the second substrate, the upper surface of the second substrate being opposite the lower surface of the second substrate.

13. The method of claim 12, wherein the hardmask layer is formed using a chemical vapor deposition technique or a physical vapor deposition technique.

14. The method of claim 13, wherein the hardmask layer comprises $SiO_2$ or a silicon nitride.

15. The method of claim 9, wherein the first set of fins forms a PFET, and wherein the second set of fins forms an NFET.

16. The method of claim 9, wherein forming a first set of trenches and forming a second set of trenches comprises etching.

17. The method of claim 16, wherein etching comprises etching by polyphosphoric acids, by hydrofluoric acid, or by potassium hydroxide.

18. The method of claim 9, further comprising forming sidewall spacers along edges of the first set of trenches and along edges of the second set of trenches before forming a first set of fins in the first set of trenches and before forming a second set of fins in the second set of trenches.

19. The method of claim 9, wherein forming a first set of fins in the first set of trenches and forming a second set of fins in the second set of trenches each comprise growing germanium or SiGe in the first set of trenches and in the second set of trenches using an aspect ratio trapping technique.

20. The method of claim 19, wherein the aspect ratio trapping technique comprises epitaxially growing the germanium or the SiGe using metal-organic chemical vapor deposition.

* * * * *